United States Patent
Ikezawa et al.

(10) Patent No.: US 6,868,733 B2
(45) Date of Patent: Mar. 22, 2005

(54) SENSOR HAVING MEMBRANE AND METHOD FOR MANUFACTURING THE SAME

(75) Inventors: Toshiya Ikezawa, Kariya (JP); Takashige Saitou, Ama-gun (JP); Masaaki Tanaka, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/759,123

(22) Filed: Jan. 20, 2004

(65) Prior Publication Data

US 2004/0163475 A1 Aug. 26, 2004

(30) Foreign Application Priority Data

Feb. 20, 2003 (JP) ........................................ 2003-042063

(51) Int. Cl.⁷ ................................................ G01L 9/00
(52) U.S. Cl. ...................................................... 73/754
(58) Field of Search .................. 73/754, 755, 715–727, 73/706; 338/4; 29/621.1, 25.01, 25.02, 25.03

(56) References Cited

U.S. PATENT DOCUMENTS

| 5,412,992 A | * | 5/1995 | Tobita et al. | ................. 73/721 |
| 6,047,604 A | * | 4/2000 | Auburger et al. | ............. 73/756 |

FOREIGN PATENT DOCUMENTS

| JP | A-H07-58134 | 3/1995 |
| JP | A-2002-33341 | 1/2002 |

* cited by examiner

*Primary Examiner*—William Oen
(74) *Attorney, Agent, or Firm*—Posz & Bethards, PLC

(57) ABSTRACT

A sensor device includes a circuit chip, an adhesion film, and a sensor chip mounted on the circuit chip through the adhesion film. The sensor chip includes a substrate having foreside and backside surfaces, a concavity disposed on the backside surface of the substrate, and a membrane disposed on the foreside surface of the substrate so that the membrane covers the concavity. The adhesion film is disposed between the sensor chip and the circuit chip so as to form a passage for connecting between the concavity and an outside of the concavity.

16 Claims, 2 Drawing Sheets

SENSOR HAVING MEMBRANE AND METHOD FOR MANUFACTURING THE SAME

CROSS REFERENCE TO RELATED APPLICATION

This application is based on Japanese Patent Application No. 2003-42063 filed on Feb. 20, 2003, the disclosure of which is incorporated herein by reference.

FIELD OF THE INVENTION

The present invention relates to a sensor having a membrane and a method for manufacturing the same.

BACKGROUND OF THE INVENTION

A stack structure type sensor device includes a sensor chip having a membrane mounted on a circuit chip with adhesion bond. The sensor chip includes a semiconductor substrate such as silicon substrate. One side of the substrate is etched so that a concavity is formed. Then, the membrane made of insulation film or the substrate itself is formed on the other side of the substrate so that the concavity of the substrate is covered with the membrane.

In a case where the sensor device is used for an acceleration sensor or an angular rate sensor, the membrane has a comb-teeth sensing portion for detecting electric capacitance. A clearance in the comb-teeth sensing portion provides a passage for passing the air from the concavity to the outside of the concavity. Therefore, even if the air in the concavity is thermally expanded, the air can be released through the passage.

However, in a case where the sensor device is used for an infrared sensor or a pressure sensor, the concavity of the substrate is sealed with the membrane air-tightly. Therefore, in case of manufacturing the device, a stress is applied to the membrane because of thermal expansion of the air in the concavity. Thus, the membrane may be broken by the stress.

A technique is disclosed in Japanese Patent Application Publication No. 2002-33341. A convexity portion is formed on one side of the circuit chip, on which the sensor chip is mounted. Thus, the sensor chip is mounted on the convexity portion so that a clearance for releasing the air is formed. The clearance is formed between the sensor chip and the circuit chip in a portion except for the convexity portion. However, it is difficult to manufacture the circuit chip having the convexity portion.

Further, the adhesion bond is a liquid type adhesion bond such as diebond paste. This technique is disclosed, for example, in Japanese Patent Application Publication No. H07-58134. When the sensor chip is mounted on the circuit chip with the adhesion bond, the adhesion bond may crawl up to the sensor chip. Therefore, the adhesion bond may stick to the membrane, so that performance of the sensor chip is reduced. Moreover, a movable portion of the membrane may be fixed so that the sensor device does not work. Thus, reliability of the stack type sensor device having the sensor chip is decreased.

SUMMARY OF THE INVENTION

In view of the above problem, it is an object of the present invention to provide a stack structure type sensor device having a sensor chip. Specifically, the sensor device has high reliability.

It is another object of the present invention to provide a method for manufacturing a stack structure type sensor device having a sensor chip.

A sensor device includes a circuit chip, an adhesion film, and a sensor chip mounted on the circuit chip through the adhesion film. The sensor chip includes a substrate having foreside and backside surfaces, a concavity disposed on the backside surface of the substrate, and a membrane disposed on the foreside surface of the substrate so that the membrane covers the concavity. The adhesion film is disposed between the sensor chip and the circuit chip so as to form a passage for connecting between the concavity and an outside of the concavity.

In the above sensor device, the adhesion film bonding between the sensor chip and the circuit chip does not crawl up. Further, the air disposed in the concavity of the substrate is prevented from pressurizing the membrane because of the thermal expansion of the air. Therefore, the sensor device has high reliability.

Further, a method for manufacturing the sensor device described above is provided. The method includes the step of forming the passage in the adhesion film, and adhering the sensor chip to the circuit chip through the adhesion film. In the sensor device manufactured by the above method, the adhesion film bonding between the sensor chip and the circuit chip does not crawl up. Further, the air disposed in the concavity of the substrate is prevented from pressurizing the membrane because of the thermal expansion of the air. Therefore, the sensor device has high reliability.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

A sensor chip having a membrane is mounted on a circuit chip with an adhesion film so that a sensor device is formed. The device is called a stack structure type sensor device. The device is suitably used for an infrared sensor, a humidity sensor, a gas sensor, an airflow sensor, an acceleration sensor, or an angular rate sensor.

Figure 1A:
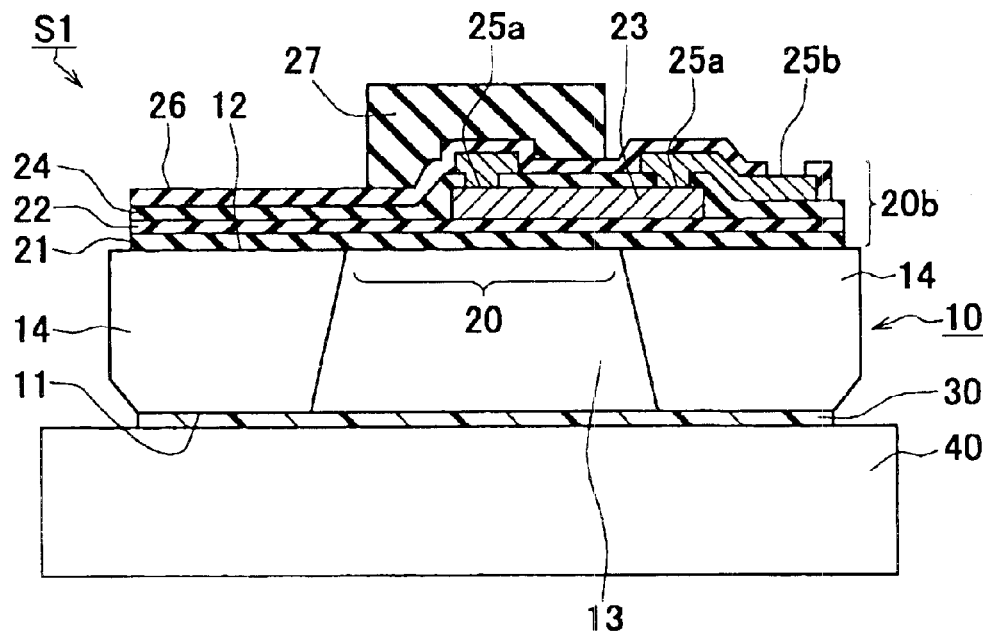
FIG. 1A is a cross-sectional view showing a sensor device according to a first embodiment of the present invention.
Figure 1B:
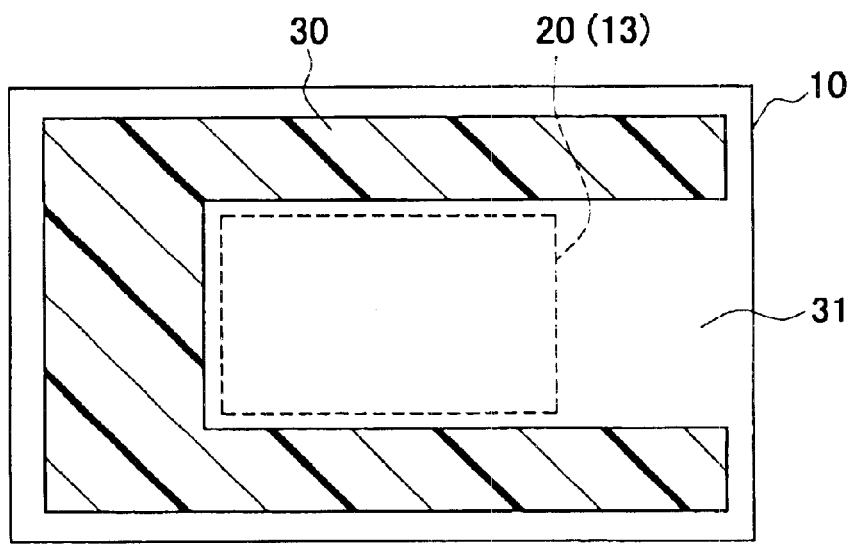
FIG. 1B is a schematic plan view explaining a relationship between a sensor chip and an adhesion film.

In a preferred embodiment of the present invention, a sensor chip in a sensor device is a thermo-pile type infrared sensor for detecting an infrared light with using an electromotive force of a thermo couple. FIGS. 1A and 1B shows a sensor device S1 according to the preferred embodiment. The sensor device S1 includes a sensor chip 10 and a circuit chip 40. The sensor chip 10 having a membrane 20 is mounted on the circuit chip with an adhesion film 30.

The sensor chip 10 is made of, for example, single crystal silicon substrate. A concavity 13 is formed on a backside surface 11 of the sensor chip 10 with using etching method and the like. The opening of the concavity 13 has a rectangle shape, as shown in FIG. 1B.

A thin film layer 20b is disposed on almost all of a foreside surface 12 of the sensor chip 10 (i.e., a substrate 14). The thin film layer 20b includes various wiring layers, various film layers, and the like, so that the thin film layer 20b provides a multi-layered structure. The thin film layer 20b further includes the membrane 20 disposed on the concavity 13 of the substrate 14 so that the membrane covers the concavity 13 air-tightly.

Specifically, the multi-layered structure of the thin film layer 20b is, for example, composed of a silicon nitride film 21, silicon oxide film 22, a poly crystalline silicon wiring layer 23, an interlayer insulation film 24, an aluminum wiring layer 25 and a passivation film 26 formed on the foreside surface 12 of the sensor chip 10 in this order.

The silicon nitride film 21 and the silicon oxide film 22 are formed on almost all of the foreside surface 12 of the sensor chip 10. The silicon oxide film 22 and the silicon nitride film 21 are formed with using a chemical vapor deposition (i.e., CVD) method and the like. The silicon nitride film 21 and the silicon oxide film 22 provide insulation films, respectively.

The poly crystalline silicon wiring layer 23 is formed on the silicon oxide film 22. Specifically, the wiring layer 23 is disposed from the center of the concavity 13 to the substrate 14 disposed on the outside of the membrane 20, i.e., the concavity 13. The wiring layer 23 is formed with using the CVD method and the like. The wiring layer 23 is made of $N^+$ type poly crystalline silicon, which includes impurities so as to reduce a wiring resistance.

The interlayer insulation film 24 is formed on the wiring layer 23 and on a part of the silicon oxide film 22, the part of the silicon oxide film 22 on which the wiring layer 23 is not formed. The interlayer insulation film 24 works as an electrical insulation of each wiring layer in the thin film layer 20b. The interlayer insulation film 24 is formed with using the CVD method and the like. The interlayer insulation film 24 is made of a silicon oxide film doped with boron oxide and phosphorous oxide (i.e., BPSG film, boron doped phosphosilicate glass film).

The aluminum wiring layer 25 is formed on the interlayer insulation film 24 so as to connect between the poly crystalline silicon wiring layers 23 neighboring each other. The aluminum wiring layer 25 is formed with using a sputtering method, a vapor deposition method or the like. The aluminum wiring layer 25 is made of aluminum and silicon, i.e., the aluminum wiring layer 25 is made of aluminum-silicon alloy (i.e., Al—Si alloy). The aluminum wiring layer 25 connects to the poly crystalline silicon wiring layer 23 electrically through a contact hole in the interlayer insulation film 24.

Specifically, a plurality of poly crystalline silicon wiring layers 23 and a plurality of aluminum wiring layers 25 are connected together in series so that a thermocouple of the infrared sensor device S1 is provided. Each wiring layer 23, 25 has a predetermined pattern, which provides a well-known thermo pile type infrared sensor, so that an electromotive force is generated at a connection portion 25a between the poly crystalline silicon wiring layer 23 and the aluminum wiring layers 25 because of the Seebeck effect. Thus, the wiring layers 23, 25 provide the thermo couple.

The thermo couple has an electrode pad. Specifically, an aluminum pad 25b as the electrode pad is formed on one end of the aluminum wiring layer 25. Here, the other end of the aluminum wiring layer 25 connects to the connection portion 25a. The aluminum pad 25b connects the thermo couple to an outer circuit electrically.

The connection portion 25a disposed on the concavity 13 provides a hot junction (i.e., a measuring junction). The connection portion 25a disposed on the outside of the concavity 13 (i.e., disposed on the substrate 14) provides a cold junction (i.e., a reference junction). A temperature difference between the hot junction and the cold junction generates an electric potential difference (i.e., a voltage). The voltage is outputted to the outside circuit through the aluminum pad 25b.

The passivation film 26 is formed on the aluminum wiring layer 25 and on the interlayer insulation film 24, on which the aluminum wiring layer 25 is not formed. The passivation film 26 is formed with using the CVD method and the like. The passivation film 26 is made of a silicon nitride film, a tetra-ethly-ortho-silicate film (i.e., TEOS film), or the like. The passivation film 26 has an opening for exposing the aluminum pad 25b.

Thus, the thin film layer 20b is composed of layers 23, 25 and films 21, 22, 24, 26. Further, an infrared absorption film 27 is formed on the membrane 20. Specifically, the infrared absorption film 27 is disposed on the center of the concavity 13 so as to cover the connection portion 25a as the hot junction.

The infrared absorption film 27 absorbs an infrared light so that the temperature of the hot junction, i.e., the connection portion 25a is effectively increased. The infrared absorption film 27 is made of polyester resin including carbon, which is annealed and hardened.

Thus, the sensor chip 10 includes the concavity 13 disposed on the backside surface 11 of the substrate 14 and the membrane 20 dispose on the foreside surface 12 of the substrate 14 for covering the concavity 13.

Next, the sensor chip 10 is manufactured as follows. At first, a single crystal silicon substrate (i.e., a single crystal silicon wafer) is prepared for forming the sensor chip 10. Here, the wafer is processed to manufacture the sensor chip 10. Therefore, after a plurality of sensor chips 10 is manufactured in the wafer, the wafer is diced and cut (i.e., dicing-cut) into individual sensor chips 10.

Next, the thin film layer 20b is formed on the wafer, which is to be the foreside surface 12 of the sensor chip 10. Specifically, the silicon nitride film 21 and the silicon oxide film 22 are formed on the wafer with using the CVD method and the like. Then, a poly crystalline silicon is formed on the silicon oxide film 22, and then the poly crystalline silicon is etched into a predetermined pattern so that the poly crystalline silicon wiring layer 23 is formed.

Next, the interlayer insulation film 24 is formed, and the contact hole is formed at a predetermined position in the interlayer insulation film 24 with using a photolithography method and the like. Then, an Al—Si alloy film is formed with using the sputtering method, the vapor deposition method, or the like. After that, the Al—Si alloy film is etched into a predetermined pattern with using the photolithography method and the like so that the aluminum wiring layer 25 and the aluminum pad 25b are formed.

Then, the passivation film 26 is formed with using the CVD method and the like, and then the passivation film 26 is etched into a predetermined pattern with using the photolithography method and the like so that the opening in the passivation film 26 for exposing the aluminum pad 25b is formed. Thus, the thin film layer 20b composing the layers 23, 25 and the films 21, 22, 24, 26 is completed.

Next, the other side of the wafer, on which the thin film layer 20b is not formed, is etched so that the concavity 13 is formed. The other side of the wafer is to be the backside surface 11 of the substrate 14. In this process, the one side of the wafer, which is to be the foreside surface 12, and a sidewall of the wafer are covered with a mask made of etchant-resist material. Then, the wafer is dipped into alkali etchant such as potassium hydroxide (i.e., KOH) solution or tetra methyl ammonium hydroxide (i.e., TMAH) solution so that the concavity 13 is formed on the other side of the wafer, which is to be the backside surface 11 of the substrate 14.

After that, the infrared absorption film 27 is formed. Thus, the sensor chip 10 is formed. Then, the wafer is diced and cut into individual sensor chips 10.

The sensor chip 10 is mounted on the circuit chip 40 with the adhesion film 30. Specifically, the backside surface 11 of the sensor chip 10 is adhered to the circuit chip 40. The adhesion film 30 is made of adhesive film including silicone resin, polyimide resin, epoxy resin or the like. The adhesive film is a solid film. The adhesive film can be available as a commercial product.

As shown I FIG. 1B, the adhesion film 30 is disposed between the sensor chip 10 and the circuit chip 40, and disposed outside of the concavity 13. The adhesion film 30 has a notch 31, so that the adhesion film 30 has a C-shape. Therefore, the adhesion film 30 is not disposed in the notch 31 between the sensor chip 10 and the circuit chip 40. The concavity 13 connects to the outside of the concavity 13 through the notch 31. Specifically, the notch 31 works as a passage between the concavity 13 and the outside. Specifically, the adhesion film 30 has a predetermined thickness, which provides the passage so that the air in the concavity sufficiently passes through the passage.

Figure 2A:
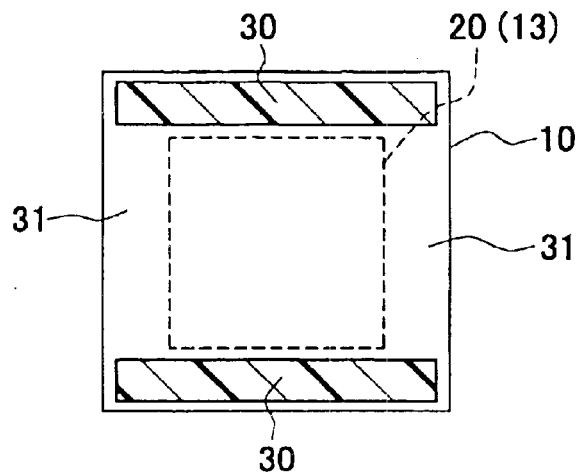
FIGS. 2A to 2C are schematic plan views explaining a relationship between a sensor chip and an adhesion film in other sensor devices according to modifications of the first embodiment.
Figure 2B:
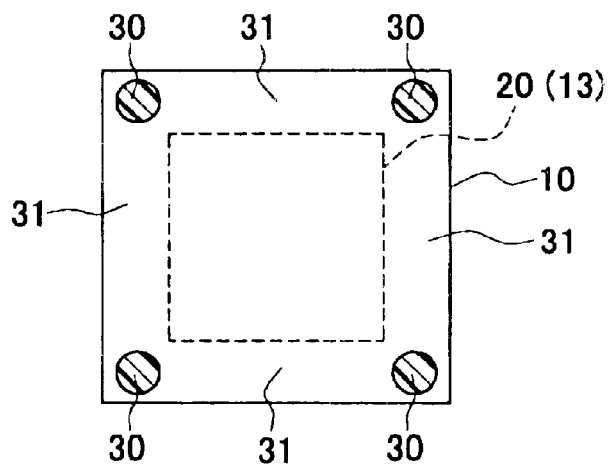
Figure 2C:
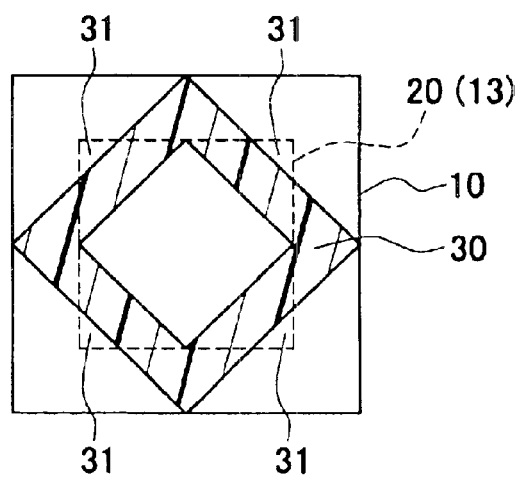

Although the adhesion film 30 has the notch 31 shown in FIG. 1B, the adhesion film 30 can have other shapes shown in FIGS. 2A to 2C. As shown in FIGS. 2A and 2B, the adhesion bond has a pair of line type shape or a four-point shape. In FIG. 2A, a pair of notches 31 is disposed between the line of the adhesion film 30, so that the passage is disposed on each notch 31. In FIG. 2B, four notches 31 are disposed between four points of the adhesion film 30, so that four passages are formed between the four points of the adhesion film 30, i.e., each passage is disposed on each side of the sensor chip 10.

Further, in FIG. 2C, the adhesion film 30 has a square ring shape. The square ring of the adhesion film 30 is disposed on the sensor chip 10 having a square shape such that the side of the adhesion film 30 and the side of the sensor chip 10 becomes an angle of 45 degree. Specifically, the adhesion film 30 is formed by rotating around the center of the sensor chip 10 by 45°. Therefore, four corners of the concavity 13 are disposed outside of the adhesion film 30, so that the four corners provide the passage.

The sensor device S1 works as an infrared sensor as follows. The hot junction of the connection portion 25a disposed on the center of the membrane 20 has a small heat conductivity, which is smaller than that of the cold junction of the connection portion 25a disposed outside of the membrane 20 (i.e., disposed on the substrate 14). Furthermore, the infrared absorption film 27 enhances the temperature increase of the hot junction compared with that of the cold junction. Therefore, when the infrared light radiates on the membrane 20, i.e., the membrane is subjected to the infrared light, the temperature of the hot junction becomes higher than that of the cold junction. Then, the temperature difference between the hot junction and the cold junction generates an electric potential difference, i.e., a voltage of the thermo couple. The thermo couple is provided by the poly crystalline silicon wiring layer 23 and the aluminum wiring layer 25. Then, the voltage is outputted from the aluminum pad 25b. Therefore, the voltage corresponds to the infrared light so that the device detects the infrared light.

Further, the notch 31 of the adhesion film 30 provides the passage between the concavity 13 and the outside of the concavity 13. Therefore, the concavity 13 is not sealed hermetically, i.e., the concavity 13 is a non-hermetically-sealed space because of the passage. Therefore, no stress is applied to the membrane 20 because the expanded air is released through the passage even when the air in the concavity 13 thermally expands in case of manufacturing the device S1. Thus, the membrane 20 is limited from being broken by the stress.

Furthermore, the adhesion film 30 is made of an adhesive film so that the adhesion film 30 does not crawl up to the sensor chip 10. Here, the conventional adhesion bond is a liquid type adhesion bond, so that the adhesion bond crawls up to the sensor chip when the sensor chip is mounted on the circuit chip with the adhesion bond. Therefore, performance of the sensor chip 10 according to the preferred embodiment is not reduced. Further, a movable portion of the membrane 20 is not fixed by the adhesion film 30.

Thus, the adhesion film 30 for bonding between the sensor chip 10 and the circuit chip 40 does not crawl up. Further, the air disposed in the concavity 13 of the substrate 14 is prevented from pressurizing the membrane 20 because of the thermal expansion of the air. Therefore, the sensor device S1 has high reliability.

Although the sensor device S1 is used for an infrared sensor, the sensor device S1 can be used for any sensor as long as the sensor device S1 includes a sensor chip having a membrane disposed on a concavity, the sensor chip mounted on a circuit chip with adhesion film. For example, the sensor device can be used for a pressure sensor, a gas sensor or a flow sensor.

Such changes and modifications are to be understood as being within the scope of the present invention as defined by the appended claims.

What is claimed is:

1. A sensor device comprising:
   a circuit chip;
   an adhesion film; and
   a sensor chip mounted on the circuit chip through the adhesion film,
   wherein the sensor chip includes:
      a substrate having foreside and backside surfaces;
      a concavity disposed on the backside surface of the substrate; and
      a membrane disposed on the foreside surface of the substrate so that the membrane covers the concavity, and
   wherein the adhesion film is disposed between the sensor chip and the circuit chip so as to form a passage for connecting between the concavity and an outside of the concavity.

2. The device according to claim 1,
   wherein the adhesion film is disposed on a periphery of the concavity, and includes a notch for providing the passage.

3. The device according to claim 1,
   wherein the adhesion film is made of adhesive film including silicone resin, polyimide resin, or epoxy resin.

4. The device according to claim 1,
   wherein the sensor chip is adhered to the circuit chip except for the passage of the adhesion film, and
   wherein the membrane is covered the concavity air-tightly.

5. The device according to claim 1,
   wherein the sensor chip provides an infrared sensor, a pressure sensor, a gas sensor or a flow sensor.

6. The device according to claim 1,
   wherein the sensor chip having the concavity is mounted on the circuit chip through the adhesion film so that the device provides a stack structure.

7. The device according to claim 1,
   wherein the sensor chip is made of silicon.

8. The device according to claim 1,
   wherein the adhesion film has a predetermined thickness, which provides the passage so that an air in the concavity sufficiently passes through the passage.

9. A method for manufacturing the sensor device according to claim 1, the method comprising the step of:

forming the passage in the adhesion film; and adhering the sensor chip to the circuit chip through the adhesion film.

10. The method according to claim 9, wherein the adhesion film is disposed on a periphery of the concavity, and includes a notch for providing the passage.

11. The method according to claim 9, wherein the adhesion film is made of adhesive film including silicone resin, polyimide resin, or epoxy resin.

12. The method according to claim 9, wherein the sensor chip is adhered to the circuit chip except for the passage of the adhesion film, and wherein the membrane is covered the concavity airtightly.

13. The method according to claim 9, wherein the sensor chip provides an infrared sensor, a pressure sensor, a gas sensor or a flow sensor.

14. The device according to claim 9, wherein the sensor chip having the concavity is mounted on the circuit chip through the adhesion film so that the device provides a stack structure.

15. The device according to claim 9, wherein the sensor chip is made of silicon.

16. The device according to claim 9, wherein the adhesion film has a predetermined thickness, which provides the passage so that an air in the concavity sufficiently passes through the passage.

* * * * *